US005781414A

United States Patent [19]

Mills et al.

[11] Patent Number: 5,781,414

[45] Date of Patent: Jul. 14, 1998

[54] EXPANSION CARD STABILIZER FOR A CIRCUIT BOARD EDGE CONNECTOR

[75] Inventors: Richard S. Mills; Jerry D. Gandre; Steven L. Sands, all of Austin, Tex.

[73] Assignee: Dell USA, L.P., Round Rock, Tex.

[21] Appl. No.: 409,764

[22] Filed: Mar. 23, 1995

[51] Int. Cl.[6] .............................. H01R 23/68; H05K 7/14

[52] U.S. Cl. .......................... 361/786; 361/785; 361/801; 361/789; 361/740; 361/747; 361/759; 439/377

[58] Field of Search .................................... 361/785, 786, 361/789, 801, 740, 747, 759; 439/64, 377, 328, 59, 325, 327

[56] References Cited

U.S. PATENT DOCUMENTS 3,905,665 9/1975 Lynch et al. .............................. 439/62

5,037,310 8/1991 Marinello .................................. 439/61

5,509,826 4/1996 White ....................................... 439/637

*Primary Examiner*—Leo P. Picard

*Assistant Examiner*—Phuong T. Vu

*Attorney, Agent, or Firm*—Skjerven, Morrill, MacPherson, Franklin & Friel, L.L.P.; Stephen A. Terrile

[57] ABSTRACT

A card stabilizer for stabilizing an expansion card inserted in a female edge connector. The card stabilizer consists of a frame member sized to extend around the female connector, locking device for locking the frame member relative to the female connector and a guide disposed on the frame member for receiving at least one end portion of the expansion card and to prevent movement and hence electrical disconnection of the expansion card in the female edge connector.

18 Claims, 3 Drawing Sheets

EXPANSION CARD STABILIZER FOR A CIRCUIT BOARD EDGE CONNECTOR

TECHNICAL FIELD

The invention relates generally to electronic circuit boards and, more specifically, to apparatus for stabilizing expansion cards inserted into edge connectors on circuit boards.

BACKGROUND OF THE INVENTION

Electronic devices, such as computers, utilize circuit carrying boards as platforms to secure and interconnect individual electronic components. Because of limitations in the useful size of planar circuit boards in computer applications, and in order to provide consumer flexibility, circuit boards are frequently designed to accommodate additional circuit boards, or expansion cards, to provide additional and/or alternative functionality. A user may decide to add new or alternative functionality to a computer system by simply adding a new expansion card. For example, many personal computer circuit boards are designed with standard bus interfaces, such as ISA (Industry Standard Architecture) and EISA (Extended Industry Standard Architecture), into which expansion cards for peripheral devices, such as hard disk controllers, tape controllers, modems and other I/O controllers, may be connected. A user may easily add or exchange an expansion device, such as a modem, by simply replacing the old modem card attached to the bus interface with a new modem card.

Typically, expansion cards are electrically connected to the circuit board through the use of "female" edge connectors located on the circuit board. Standard female edge connectors contain a number of electrically conductive pins enclosed in a "female" receptacle, each pin representative of a specific signal in the female edge connector. Expansion cards contain a "male" edge for insertion into the female receptacle in the female edge connector. This male edge connector is designed with contacts corresponding to each pin in the female edge connector, such that when the male edge connector is press fit into the female receptacle the corresponding pins of the female edge connector are biased against the respective signal contacts on the male edge connector to create a secure electrical connection between the contacts and the connector pins.

The female edge connector not only creates a secure electrical connection between the expansion card and the female edge connector, but also secures the expansion card in place. Standard female edge connectors support the expansion card through press-fit by grasping the male edge connector. Unfortunately, this design allows expansion cards to move relative to the female edge connector, often as a result of the placement of components on the expansion card, causing unbalanced weight distribution on the card, or due to movement, intended or accidental, of the computer system. When the female edge connector insufficiently grasps the expansion card and movement of the expansion card occurs, contact between the pins in the female edge connector and the contacts on the male edge connector may disengage, causing the expansion card to momentarily, or permanently lose electrical connection with the female edge connector. Such electrical disconnects can result in transient or catastrophic faults in the computer system.

In order to prevent unacceptable relative movement between the female edge connector and the male edge connector, various devices have been utilized. For example, prior art female edge connectors, such as that made by Burndy, have incorporated integral channels extending vertically from one or more ends of the female edge connector, into which the expansion card is guided to stabilize and support the expansion card. For ease of expansion card insertion, the channels in prior art female edge connectors have been angled such that the cross-section of the channel at the farthest point from the female edge connector is wider than the cross-section of the channel where the channel contacts the female edge connector. Unfortunately, such angling has allowed the expansion card to rotate (i.e., move laterally) in the female edge connector through the channel angle.

Other prior art designs have attempted to limit relative movement by using card guides and brackets external to the female edge connector. These card guides and brackets are either mounted directly on the circuit board or connected to the computer chassis itself and can occupy valuable circuit board or chassis space.

Unfortunately, the prior art designs require computer makers to foresee the necessity of expansion card stabilization to alleviate unacceptable relative movement in connection with specific expansion cards. However, computer designers usually have no ability to predict the type of expansion card that will be installed, particularly when expansion cards are constantly evolving and may not exist or be conceived of at the design stage. This problem is particularly acute when it is recognized that, while the male and female edge connectors have fixed size constraints, the remainder of the expansion card may be designed to extend beyond the ends of the female edge connector. Therefore, when confronted with either of the prior art stabilization designs, the computer designer or computer user may discover that the expansion card that is to be added is precluded because the integral channel in the female edge connector, or card guides and brackets, conflict with the expansion card's dimensions.

Furthermore, even if a standard developed around one of the prior art designs, the computer designer would have to either initially install a female edge connector with an integral channel or install card guides and brackets onto the circuit board or chassis itself. This would not only add potentially unnecessary cost to the computer system, but would also consume limited and valuable circuit board and/or chassis space.

Because of the above concerns, coupled with the highly space and cost sensitive nature of modern computer systems, the vast majority of existing edge connectors in currently existing computer systems do not have any additional stabilization apparatus other than the inherent stabilization created by the gripping of the female edge connector pins against the male edge connector. If it is determined that additional lateral stabilization is required on such an installed female edge connector, the user is forced to remove the existing female edge connector and install a prior art-type female edge connector with some, although inadequate, stabilization capability. As is apparent to one familiar with computers systems, such a process is complicated, time consuming and can result in serious damage to the computer system itself, even when conducted by a qualified technician.

Further, retrofitting systems by adding card guides and brackets presents an even greater danger to the computer system as most card guides are secured to the circuit board itself, generally through drilling, which can easily result in interference with signal traces and electrical components on the circuit board. Similarly, the location of the female edge connector on a populated circuit board may be such that there is no practicable means to secure the card guides and/or brackets to the chassis itself.

As a consequence, there exists a need for an apparatus to provide stabilization for expansion cards in female edge connectors which may be added to the edge connectors after the computer circuit board and chassis are designed, and which does not occupy inordinate circuit board space.

SUMMARY OF THE INVENTION

The edge connector card stabilizer of the present invention avoids and overcomes the above-mentioned disadvantages and drawbacks characteristic of the prior art. According to the present invention and in a departure from the prior art, the card stabilizer consists of a frame member, having two side portions and two end portions, which is sized to extend around a female edge connector mounted on a circuit board. Spring tabs are attached to the underside of the side portions for locking the frame member relative to the female edge connector when press fit thereon, to prohibit movement of the card stabilizer away from the circuit board. Attached to each end portion, and preferably integral thereto, is a guide member designed to receive the ends of an expansion card inserted in the female edge connector and to restrict the horizontal movement of the expansion card in the female edge connector.

In another aspect, stop tabs are also attached to the top of the side portions for locking the frame member relative to the female edge connector to prohibit movement of the card stabilizer toward the circuit board. Each guide member contains two rails extending from the frame member to the top of the guide member to form a channel to receive the expansion card. The rails are angled toward each other as they extend from the frame member such that they form a friction fit against the sides of the expansion card at the point furthest from the frame member. The rails may also be attached to an end to form a closed channel to receive the end of the expansion card.

The invention results in several technical advantages. Generally, the invention provides expansion card stabilization for standard female edge connectors which have been previously mounted on a circuit board without disturbing the circuit board or chassis.

A further technical advantage is the added stability created through the use of rails in the guide member that narrow to provide a friction fit against the sides of the expansion card at the point furthest from the frame member.

DESCRIPTION OF THE PREFERRED EMBODIMENT

Figure 1A:
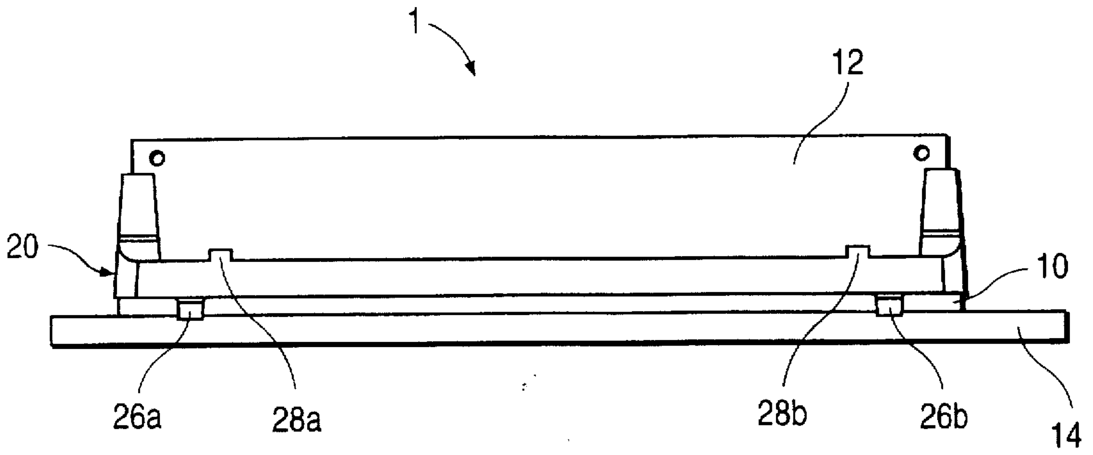
FIGS. 1A and 1B are a side elevational views of the stabilizer of the present invention being used to stabilize a card in a female edge connector of a circuit board.
Figure 1B:
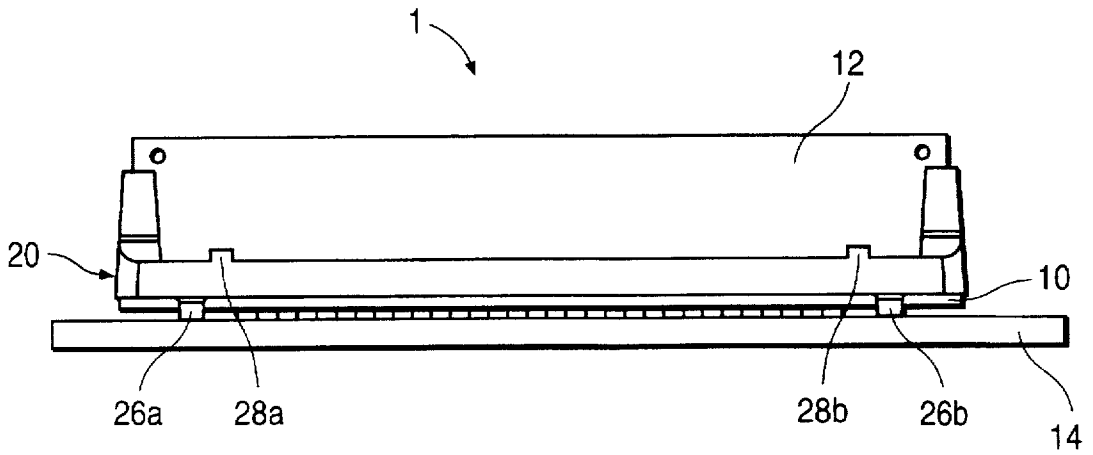

In FIGS. 1A and 1B, the reference numeral 1 refers to a card stabilizer system of the present invention. The system 1 includes a female edge connector 10 for receiving an electronic circuit card 12, a circuit board 14 electrically connected to the connector 10 and a stabilizer 20 for stabilizing the card 12 securely in the connector 10 so that there is no electrical interruption between the card and the board. It is understood the board may be any type of electronics board, including the motherboard of a personal computer (not shown).

Figure 2:
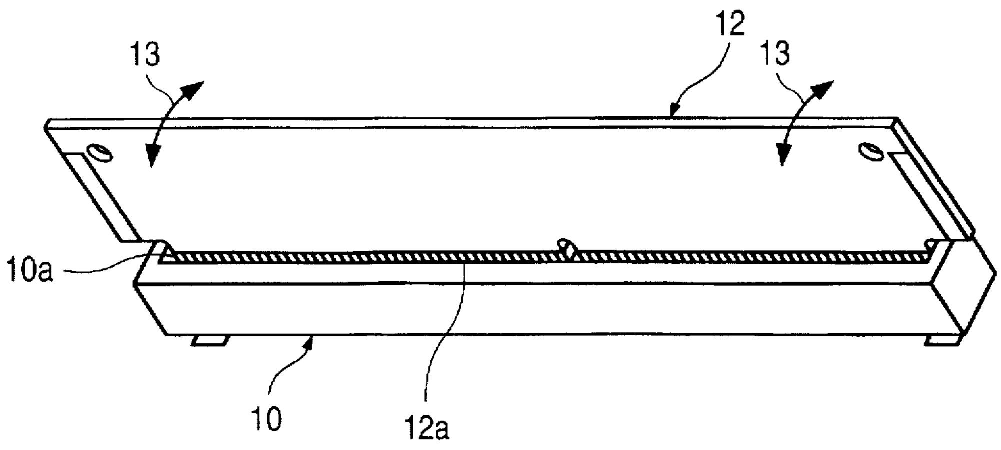
FIG. 2 is a perspective view of the female edge connectors of FIGS. 1A and 1B with an expansion card press-fit therein, without the stabilizer of the present invention.
Figure 3:
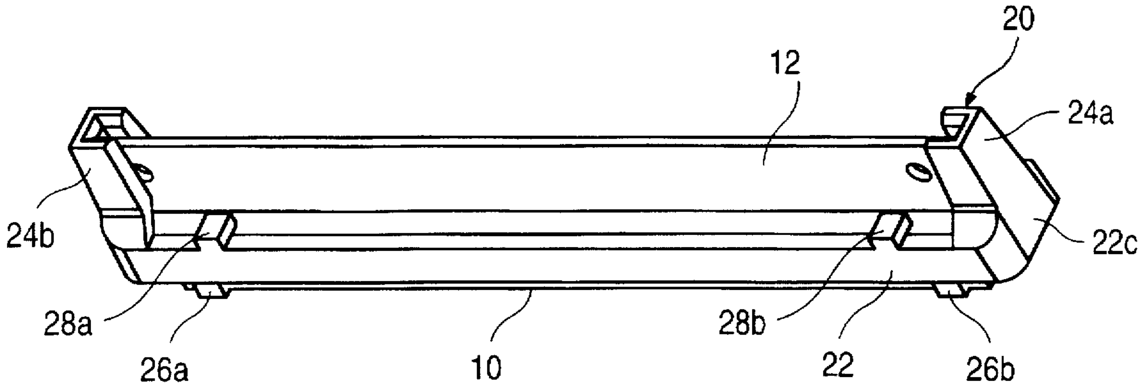
FIG. 3 is an enlarged perspective view of the female edge connectors of FIGS. 1A and 1B with an expansion card press-fit therein, with the stabilizer of the present invention supporting the card.
Figure 4:
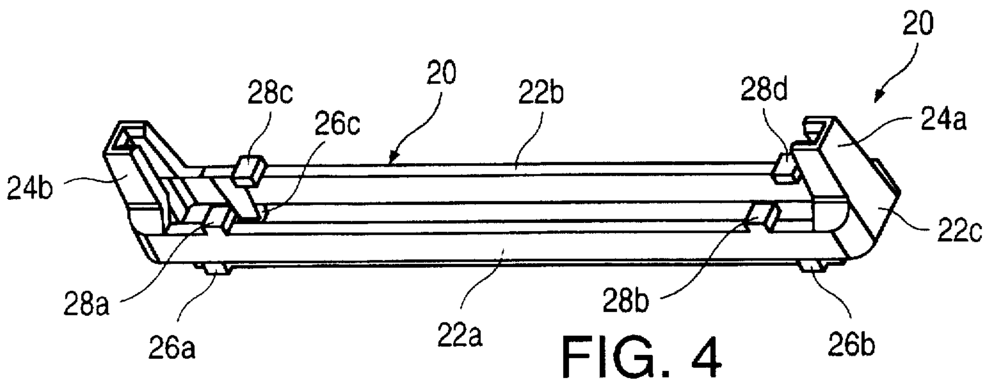
FIG. 4 is a perspective view of the stablizers of FIGS. 1A and 1B of the present invention.
Figure 5:
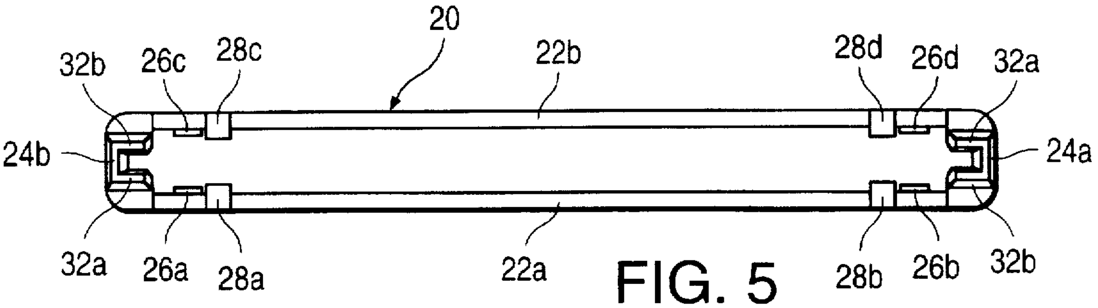
FIG. 5 is an overhead view of the stablizers of FIGS. 1A and 1B of the present invention.
Figure 6:
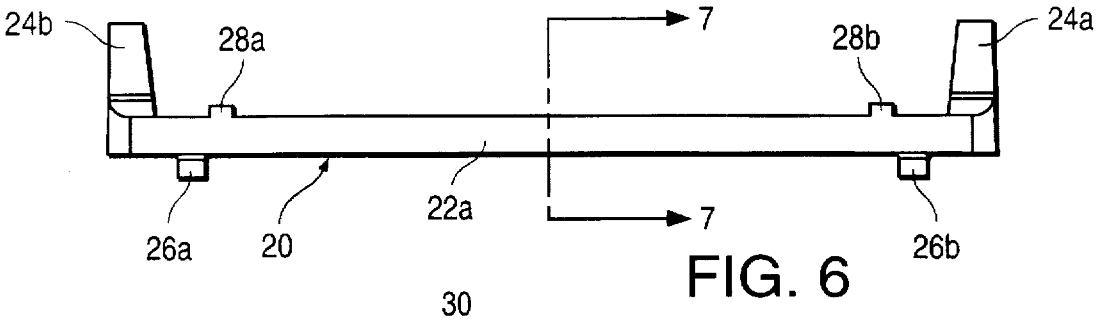
FIG. 6 is a side elevational view of the stablizers of FIGS. 1A and 1B of the present invention.

In FIG. 2, the edge connector 10 is shown with the expansion card 12 press fit therein, with the connector 10 mounted on the circuit board 14 (FIG. 1). The female edge connector 10 has a center-line located female receptacle, or channel, 10*a* which accepts the male edge connector 12*a* of the expansion card 12 by being press fit therein. Although not shown, it is understood that the female receptacle 10*a* contains a plurality of electrically conductive pins corresponding to electrical signals of the female edge connector 10, and that the male edge connector 12*a* contains electrical contacts corresponding to each pin in the female receptacle 10*a*. When the male edge connector 12*a* is press fit in the female receptacle 10*a*, the pins bias against the contacts on the male edge connector 12*a* in a conventional manner to secure the expansion card 12 and to create an electrical connection between the contacts and the pins. As shown, the expansion card 12 is secured in the female edge connector 10 solely by the male edge connector 12*a*. Accordingly, the weight of the expansion card 12 or lateral movement (indicated by arrows 13) of the card relative to the circuit board 14 may cause the male edge connector 12*a* to rotate or shift in the female receptacle 10*a*, which can cause electrical disconnections between the pins in the female edge connector 10 and the contacts of the expansion card 12.

FIGS. 3–7 illustrate the preferred embodiment of the card stabilizer 20 of the present invention. The stabilizer 20 is constructed of injection-molded plastic or other nonconductive, rigid yet relatively flexible, material. The stabilizer 20 consists of a frame member 22 which is sized to extend around the female edge connector 10. The frame member 22 is composed of two side portions 22*a*, 22*b* and two end portions 22*c*, 22*d*. The frame member 22 is designed such that its inner surfaces engage the outer surface of female edge connector 10 to secure the frame member around the female edge connector 10. Attached to each end portion 22*c*, 22*d* is a respective guide member 24*a*, 24*b*, each of which is preferably constructed integral with the end portions 22*c*, 22*d*. As will be further discussed in connection with FIG. 7, the guide members 24*a*, 24*b* are designed to receive the side edges of the card 12, in a sufficiently close, friction fit to prevent movement of the card 12 in the female receptacle 10*a*.

Attached to the underside, opposing ends of each of the side portions 22*a*, 22*b* are spring tabs 26*a*, 26*b* and 26*c*, 26*d*, respectively. The spring tabs 26*a–d* are designed to lock the frame member 22 to the underside of the edge connector 10, when the card stabilizer 20 is secured in place. When the spring tabs 26*a–d* are engaged against the underside of the female edge connector 10, the spring tabs prohibit vertical movement of the frame member 22 relative to the connector 10 and away from the circuit board 14 on which the connector is mounted. The spring tabs 26a–d may additionally contact the circuit board 14 and provide support to the underside of the female connector 10 holding it in an elevated position relative to the circuit board 14.

Attached to the top of each of the side portions 22a, 22b are stop tabs 28a, 28b and 28c, 8d, respectively. The stop tabs 28a–d are designed to contact the top of the female connector 10 and prohibit vertical movement of the card stabilizer 20 relative to the female edge connector 10 and toward the circuit board 14.

When the spring tabs 26a–d are engaged against the underside of the female edge connector 10, and the stop tabs 28a–d engage the top of the female connector 10, the spring tabs 26a–d and the stop tabs 28a–d provide counterposing resistance relative to each other and lock the card stabilizer 20 to the female connector 10 in a manner preventing movement of the card stabilizer 20 in both the horizontal and vertical planes relative to the female connector 10.

Figure 7:
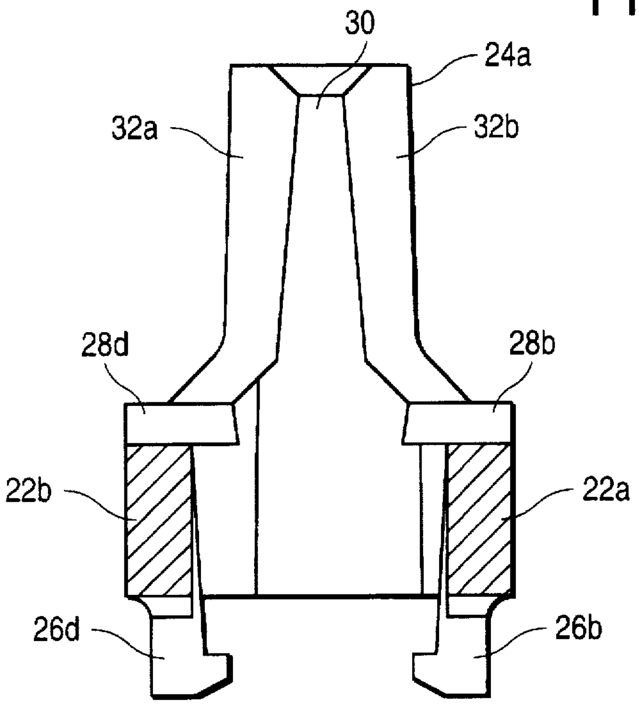
FIG. 7 is a broken-away, enlarged end view of the stabilizer taken along line 7—7 of FIG. 6.

FIG. 7 illustrates the guide member 24a, it being understood the guide members 24a and 24b are identical and located at opposing ends of the stabilizer 20. The guide members 24a, 24 stabilize the card 12 relative to the connector 10. The guide member 24a is formed integral with the side portions 22a, 22b. The guide member 24a contains an end 30 forming a wall designed to restrict movement of the expansion card 12 in a horizontal direction along the center-line of the connector 10. Attached to the end 30 and each side of guide member 24a is a rail 32a, 32b which extends from the top of each side portion 22a, 22b to the top of the guide member 24a. The rails 32a, 32b and the end 30 form a channel to receive the end of the card 12. The rails 32a, 32b are angled slightly towards each other as they extend away from the top of the side portions 22a, 22b such that the rails form a relatively close, friction fit against the sides of the expansion card 12 at the point furthest from the frame member 22. The rails restrict movement of the expansion card 12 relative to the female receptacle 10a in a direction perpendicular to the center-line of the female edge connector 10. By providing for the rails 32a, 32b to have their narrowest point at the point farthest from the frame member 22, the card stabilizer 20 is better able to support and counteract movement of the expansion card 12.

In operation, the stabilizer 20 is installed on the connector 10 by placing it over and to one side of the connector, so that (for example) the spring tabs 26a, 26c at one end of the stabilizer may be moved into place on the underside of the connector and the stop tabs at the same end of the stabilizer may be moved into place on the top of the connector. The stabilizer is then slid sideways toward the opposing side of the connector, whereby the side walls 22a, 22b flex and permit the spring tabs 26b, 26d to snap into place on the underside of the connector 10 and the stop tabs 28b, 28d to rest on top of the connector. The frame 22 thus fits snugly around the four sides of the connector 10 to hold the stabilizer 20 securely in place, without requiring separate attachment to the board 14. The spring tabs 26a–d and stop tabs 28a–d prevent vertical movement in either direction of the stabilizer 20 relative to the connector 10. The stabilizer 20 may also be easily removed in a reverse of this procedure.

The card 12 is then installed in the connector 10 by sliding it into the guide members 24a, 24b. The card 12 is received in the channels formed by the rails 32a, 32b and the end 30 in the guide member 24b. Similar rails and an end in the guide member 24b receive the card 12. Because the rails 32a, 32b are angled with their point of nearest proximity at the top of the guide member 24b, the card 12 is stabilized at the top of the stabilizer 20 from unwanted movement and fits snugly by friction between the rails 32a, 32b. The lower portion of the rails 32a, 32b are spaced farther from each other thereby allowing the card 12 to be more easily removed and inserted into the connector 10, while still being fitted snugly in place.

Referring again to FIG. 3, there is shown the card stabilizer 20 of the present invention installed on the connector 10 and supporting a card 12 in a stable position. The stabilizer 20 is secured to the connector 10 by the frame member 22, spring tabs 26a–d and stop tabs 28a–d. Each end of the card 12 is secured in the channel in the guide members 24a, 24b which prohibits horizontal movement of the expansion card 12 out of the plane of its insertion relative to the female edge connector 10.

Several technical advantages result from the foregoing. Because the stabilizer 20 is able to press fit around the female card connector 10 it need not be added until after assembly of the circuit board 14 and then only when it is determined that the particular expansion card 12 requires additional stabilization. Further, since stabilizer 20 is not integral to the female card connector 10, the circuit board 14 or the computer chassis (not shown) it does not consume valuable space on the circuit board 14 and may be removed at any time.

Although an illustrative embodiment of the invention has been shown and described, other modifications, changes, and substitutions are intended in the foregoing disclosure. For example, the card stabilizer may contain only one guide member, fewer spring tabs and no stop tabs, the spring tabs and stop tabs may have alternate construction and placement, and the guide member may have no end. Accordingly, it is appropriate that the appended claims be construed broadly and in a manner consistent with the scope of the invention.

What is claimed is:

1. A card stabilizer for stabilizing an expansion card inserted along a plane of insertion in an edge connector mounted on a circuit board, the stabilizer comprising:

a frame member extending around the edge connector;

a locking means locking the frame member relative to the edge connector, the locking means including at least one spring tab disposed on the frame member and engaging the edge connector and locking the frame member against movement relative to the edge connector in a first direction in the plane of insertion, wherein said spring tab engages said board and supports said edge connector by holding said edge connector in an elevated position relative to said board; and a guide means disposed on the frame member for receiving at least one end portion of the expansion card and for preventing movement of the expansion card out of the plane of insertion.

2. The card stabilizer of claim 1 wherein said at least one spring tab is disposed on the underside of said frame member, said locking means further comprising at least one stop tab disposed on the top of said frame member engaging said edge connector and locking said frame member against movement in a second direction, the second direction being in the plane of insertion.

3. The card stabilizer of claim 2 wherein said first direction is a direction in the plane of insertion and away from said board and said second direction is a direction in the plane of insertion and toward said board.

4. The card stabilizer of claim 1 wherein inner surfaces of said frame member engage corresponding outer surfaces of said connector to prevent movement of said frame member relative to said connector.

5. The card stabilizer of claim 1 wherein said guide means includes a channel for receiving said end portion, at least one portion of said channel having a cross-section substantially corresponding to the thickness of said expansion card to receive said end portion in a friction fit to prevent said movement of said expansion card in a direction out of the plane of insertion.

6. The card stabilizer of claim 5 wherein said channel is angled such that the widest portion of said channel is located in closest proximity to said connector and said at least one portion of said channel is located farthest away from said connector.

7. The card stabilizer of claim 1 wherein said guide means receives both end portions of said expansion card.

8. The card stabilizer of claim 1 wherein said frame member comprises two side portions engaging the respective side portions of said connector and two end portions engaging the respective end portions of said connector.

9. The card stabilizer of claim 8 wherein said guide means comprises an extension of each of said end portions of said frame member.

10. A personal computer, comprising:

an electronic circuit board;

an edge connector electrically connecting to the board, the edge connector mounted on the electronic circuit board and adapted to receive an expansion circuit card; and a card stabilizer for stabilizing an expansion card inserted in the edge connector along a plane of insertion, the stabilizer including:

a frame member extending around the edge connector;

a locking means locking the frame member relative to the edge connector, the locking means including at least one spring tab disposed on the frame member and engaging the edge connector and locking the frame member against movement relative to the edge connector in a first direction in the plane of insertion, wherein the spring tab engages the electronic circuit board and supports the connector by holding the connector in an elevated position relative to the electronic circuit board; and a guide means disposed on the frame member for receiving at least one end portion of the expansion card and for preventing movement of the expansion card out of the plane of insertion.

11. The personal computer of claim 10 wherein the at least one spring tab is disposed on the underside of the frame member, the locking means further comprising at least one stop tab disposed on the top of the frame member engaging the edge connector and locking the frame member against movement in a second direction, the second direction being in the plane of insertion.

12. The personal computer of claim 11 wherein the connector is mounted on the electronic circuit board and wherein the first direction is a direction in the plane of insertion and away from the electronic circuit board and the second direction is a direction in the plane of insertion and toward the electronic circuit board.

13. The personal computer of claim 10 wherein inner surfaces of the frame member engage corresponding outer surfaces of the connector to prevent movement of the frame member relative to the connector.

14. The personal computer of claim 10 wherein the guide means includes a channel for receiving the end portion, at least one portion of the channel having a cross-section substantially corresponding to a thickness of the expansion card to receive the end portion in a friction fit to prevent the movement of the expansion card in a direction out of the plane of insertion.

15. The personal computer of claim 14 wherein the channel is angled such that the widest portion of the channel is located in closest proximity to the connector and the at least one portion of the channel is located farthest away from the connector.

16. The personal computer of claim 10 wherein the guide means receives both end portions of the expansion card.

17. The personal computer of claim 10 wherein the frame member comprises two side portions engaging the respective side portions of the connector and two end portions engaging the respective end portions of the connector.

18. The personal computer of claim 17 wherein the guide means further comprises an extension of each of the end portions of the frame member.

* * * * *

UNITED STATES PATENT AND TRADEMARK OFFICE

CERTIFICATE OF CORRECTION

PATENT NO. : 5,781,414

DATED : July 14, 1998

INVENTOR(S) : Mills, Richard S.; Gandre, Jerry D.; Sands, Steven L.

It is certified that error appears in the above-identified patent and that said Letters Patent is hereby corrected as shown below:

Col. 5, line "14.", insert --See, for example, FIG. 1B.--

Signed and Sealed this

Twenty-third Day of February, 1999

Attest:

Q. TODD DICKINSON

Attesting Officer

*Acting Commissioner of Patents and Trademarks*